US010070516B1

(12) United States Patent
Shih et al.

(10) Patent No.: US 10,070,516 B1
(45) Date of Patent: Sep. 4, 2018

(54) MULTILAYER STRETCHABLE FILMS FOR FLEXIBLE PRINTED CIRCUITS AND METHODS OF MAKING

(71) Applicant: Eastman Chemical Company, Kingsport, TN (US)

(72) Inventors: Wayne Ken Shih, Kingsport, TN (US); Kimberley Carmenia Carico, Kingsport, TN (US)

(73) Assignee: Eastman Chemical Company, Kingsport, TN (US)

( * ) Notice: Subject to any disclaimer, the term of this patent is extended or adjusted under 35 U.S.C. 154(b) by 0 days.

(21) Appl. No.: 15/623,032

(22) Filed: Jun. 14, 2017

(51) Int. Cl.
| | |
|---|---|
| *H05K 1/02* | (2006.01) |
| *C08J 5/18* | (2006.01) |
| *B32B 25/08* | (2006.01) |
| *B32B 25/14* | (2006.01) |
| *H05K 3/12* | (2006.01) |
| *H05K 3/00* | (2006.01) |
| *H05K 1/03* | (2006.01) |
| *B29C 47/06* | (2006.01) |
| *B29K 67/00* | (2006.01) |
| *B29L 31/34* | (2006.01) |

(52) U.S. Cl.
CPC ........... *H05K 1/0283* (2013.01); *B32B 25/08* (2013.01); *B32B 25/14* (2013.01); *C08J 5/18* (2013.01); *H05K 1/036* (2013.01); *H05K 1/0326* (2013.01); *H05K 1/0393* (2013.01); *H05K 3/0014* (2013.01); *H05K 3/12* (2013.01); *B29C 47/065* (2013.01); *B29K 2067/00* (2013.01); *B29L 2031/3425* (2013.01); *B32B 2457/08* (2013.01); *C08J 2367/02* (2013.01); *C08J 2467/02* (2013.01); *H05K 2201/0133* (2013.01); *H05K 2201/0145* (2013.01); *Y10T 428/1397* (2015.01); *Y10T 428/31504* (2015.04); *Y10T 428/31507* (2015.04)

(58) Field of Classification Search
CPC ..... Y10T 428/31507; Y10T 428/31504; Y10T 428/1397
See application file for complete search history.

(56) References Cited

U.S. PATENT DOCUMENTS

| | | |
|---|---|---|
| 5,118,760 A | 6/1992 | Blakely |
| 5,290,631 A | 3/1994 | Fleury |
| 5,654,347 A | 8/1997 | Khemani et al. |
| 7,094,465 B2 | 8/2006 | Peiffer |
| 7,220,477 B2 | 5/2007 | Funagi |
| 7,297,755 B2 | 11/2007 | Shelby et al. |
| 8,071,695 B2 | 12/2011 | Strand et al. |
| 8,158,710 B2 | 4/2012 | Vollenberg |
| 2005/0064154 A1* | 3/2005 | Aylward ............... B41M 3/006 428/195.1 |
| 2005/0124779 A1* | 6/2005 | Shelby ...................... C08J 5/18 528/206 |
| 2012/0189832 A1 | 7/2012 | Kawasaki |

FOREIGN PATENT DOCUMENTS

| | | | |
|---|---|---|---|
| WO | WO 2007 001574 A1 | 1/2007 | |
| WO | WO 2012 151223 A1 | 11/2012 | |

OTHER PUBLICATIONS

Choi, Myeon-Cheon et al.; "Polymers for flexible displays: From material selection to device applications"; Progress in Polymer Science, 33; 2008; pp. 581-630.
Wagner, Sigurd and Bauer, Siegfried; "Materials for stretchable electronics"; MRS Bulletin, vol. 37; Mar. 2012; pp. 207-213.
Co-pending U. S. Patent Application filed concurrently herewith entitled, "Extruded Stretchable Substrates for Flexible Printed Circuits and Methods of Making"; Wayne Ken Shih and Kimberley Carmenia Carico.

\* cited by examiner

*Primary Examiner* — Betelhem Shewareged
(74) *Attorney, Agent, or Firm* — James Arnold, Jr.

(57) ABSTRACT

Herein disclosed are s extruded and multilayer films suitable for use as a substrate for printed circuits that afford the simultaneous achievement of both excellent mechanical properties, printability and ink curing stability, flexability and stretchability, and electronic performance. The films can be prepared from cycloaliphatic polymers and polyester elastomers.

20 Claims, 3 Drawing Sheets

MULTILAYER STRETCHABLE FILMS FOR FLEXIBLE PRINTED CIRCUITS AND METHODS OF MAKING

BACKGROUND

Traditionally rigid electronics are built on ubiquitous printed circuit boards (PCB) which are neither flexible nor stretchable. Flexible electronics are, typically called flexible printed circuits (FPC), soldered on polyimide substrate which is flexible but not stretchable. Stretchable electronics, on the other hand, are printed components and/or mounting rigid components using serpentine interconnects on a stretchable substrate which is both flexible and stretchable. Potential applications for stretchable electronics are emerging such as soft robotics, energy generation and storage devices, wearable sensors, antennas, transparent conductive electrodes, and foldable/bendable OLED displays having a stretchable backplane, touch sensor and interconnects.

Current stretchable substrates are PDMS (polydimethyl siloxane) and TPU (thermal plastic urethane). TPU has hydrolytic, stability, weatherability and washability issues. PDMS has good biocompatibility, thermal stability, but is difficult to print due to poor wettability, adhesion, and surface treatment. Typical techniques for fabricating devices on elastomeric substrates entail solvent deposition followed by lithographic patterning, deposition through a patterned shadow mask, transfer of devices by printing, and additive printing. Solvents in photolithography and printing inks may swell PDMS which results in device delamination. In addition, due to the high CTE (coefficient of thermal expansion) of PDMS, ~300 ppm/° C., its dimensions may vary noticeably during the temperature cycles in thermal processing.

Thus, there remains a need for extruded or coextruded multilayer films suitable for use as a substrate for printed circuits that afford the simultaneous achievement of excellent mechanical properties, printability and ink curing stability, flexability and stretchability, and electronic performance. This invention achieves this, in part, by tuning the modulus of substrate using two-component blends.

SUMMARY OF INVENTION

An embodiment of the invention, an extruded film adapted for use as a substrate for a printed circuit. The extruded film includes (a). a polyester elastomer component having a diacid component that has 98 to 100 mole % of the residues of 1,4-cyclohexanedicarboxylic acid; a diol component having (i) 75 to 96 mole % of the residues of 1,4-cyclohexanedimethanol and (ii) 4 to 25 mole % of the residues of poly(tetramethylene ether) glycol having a molecular weight of 500 to 1100; and 0.1 to 2 mole %, based on the mole % of the diacid or diol component, of a branching agent having at least three functional groups selected from hydroxyl and carboxyl; and (b). a cycloaliphatic polymer component having a diacid component that has 98 to 100 mole % of the residues of 1,4-cyclohexanedicarboxylic acid; and a diol component comprising 95 to 100 mole % of the residues of 1,4-cyclohexanedimethanol. The cycloaliphatic component may be poly(1,4-cyclohexylenedimethylene-1,4-cyclohexanedicarboxylate). The extruded film may include an electroconductive ink printed on a surface of the substrate and the film may be oriented in at least one direction.

In an alternative embodiment, a method of making an extruded film is provided. The method includes providing a polyester elastomer component; providing a cycloaliphatic component; combining the polyester elastomer component and cycloaliphatic component, and extruding the combination to create an extruded film. The method may also further include printing an electroconductive ink on the substrate of the extruded film.

In an alternative embodiment, a stretchable printed circuit film is provided. The substrate includes a film made from a blend including a polyester elastomer component that includes a diacid component having 98 to 100 mole % of the residues of 1,4-cyclohexanedicarboxylic acid; a diol component having (i) 75 to 96 mole % of the residues of 1,4-cyclohexanedimethanol and (ii) 4 to 25 mole % of the residues of poly(tetramethylene ether) glycol having a molecular weight of 500 to 1100; and 0.1 to 2 mole %, based on the mole % of the diacid or diol component, of a branching agent having at least three functional groups selected from hydroxyl and carboxyl. It also includes a cycloaliphatic component that includes a diacid component having 98 to 100 mole % of the residues of 1,4-cyclohexanedicarboxylic acid; and a diol component including 95 to 100 mole % of the residues of 1,4-cyclohexanedimethanol. An electroconductive ink may also be printed on a surface of the substrate. The cycloaliphatic component may be poly(1,4-cyclohexylenedimethylene-1,4-cyclohexanedicarboxylate) and the film may be uniaxially or biaxially oriented. Articles of manufacture may encompass the stretchable printed circuit film. These include a wearable device, a curved display, or a foldable electronic device.

In an alternative embodiment, a method of making the stretchable printed circuit is provided. The method includes providing a polyester elastomer component; providing a cycloaliphatic component; combining the polyester elastomer component and cycloaliphatic component, extruding the combination to create an extruded film; printing an electroconductive ink on the substrate; and curing the ink on the substrate. The method may further incorporate the stretchable printed circuit film into an article of manufacture. Representative articles of manufacture include a wearable device, a curved display, or a foldable electronic device.

In yet other embodiments of the invention multilayer films are provided. In an embodiment, a multilayer film adapted for use as a substrate for a printed circuit is provided. The film includes at least one layer comprising a polyester elastomer which comprises a diacid component comprising 98 to 100 mole % of the residues of 1,4-cyclohexanedicarboxylic acid; a diol component comprising (i) 75 to 96 mole % of the residues of 1,4-cyclohexanedimethanol and (ii) 4 to 25 mole % of the residues of poly(tetramethylene ether) glycol having a molecular weight of 500 to 1100; and 0.1 to 2 mole %, based on the mole % of the diacid or diol component, of a branching agent having at least three functional groups selected from hydroxyl and carboxyl. The film also includes at least one layer including a cycloaliphatic which comprises a diacid component comprising 98 to 100 mole % of the residues of 1,4-cyclohexanedicarboxylic acid; and a diol component comprising 95 to 100 mole of the residues of 1,4-cyclohexanedimethanol. The multilayer film may include at least one adhesive layer between at least one layer comprising a polyester elastomer and at least one layer comprising a cycloaliphatic. The cycloaliphatic component may be poly(1,4-cyclohexylenedimethylene-1,4-cyclohexanedicarboxylate). Further, electroconductive ink may be printed on a surface of the substrate. The film can have various layering arrangements including polyester elastomer/cycloaliphatic, polyester elastomer/cycloaliphatic/polyester elastomer, or cycloaliphatic/polyester elastomer/cycloaliphatic, and each layer can be oriented in at least one direction. It can also have various microlayer arrangements where the film can have up to hundreds or even thousands of different layers.

In an alternative embodiment, a method of making a multilayer film is provided. The method includes providing at least one polyester elastomer layer and at least one cycloaliphatic layer and providing and executing a means for communicating the at least one polyester elastomer layer with the at least one cycloaliphatic layer to create a multilayer film. The method may also include printing an electroconductive ink on at least one layer of the multilayer film. Further, the method may include various means for communicating the at least one polyester elastomer layer with the at least one cycloaliphatic layer including co-extrusion, lamination, and/or extrusion coating.

In an alternative embodiment, a stretchable printed circuit film is provided. The substrate includes a multilayer film that includes a substrate having a multilayer film. The multilayer film includes at least one film layer having a polyester elastomer component having a diacid component that includes 98 to 100 mole % of the residues of 1,4-cyclohexanedicarboxylic acid; a diol component including (i) 75 to 96 mole % of the residues of 1,4-cyclohexanedimethanol and (ii) 4 to 25 mole % of the residues of poly(tetramethylene ether) glycol having a molecular weight of 500 to 1100; and 0.1 to 2 mole %, based on the mole % of the diacid or diol component, of a branching agent having at least three functional groups selected from hydroxyl and carboxyl; It also includes at least one film layer including g a cycloaliphatic component having a diacid component including 98 to 100 mole % of the residues of 1,4-cyclohexanedicarboxylic acid; and a diol component including 95 to 100 mole % of the residues of 1,4-cyclohexanedimethanol. It also includes an electroconductive ink printed on at least one surface of at least one film layer of the substrate. The cycloaliphatic component may be poly(1,4-cyclohexylenedimethylene-1,4-cyclohexanedicarboxylate). The at least one film layer is oriented in at least one direction. Further, the film may be included in articles of manufacture including a wearable device, a curved display, or a foldable electronic device.

In an alternative embodiment, a method of making the stretchable printed circuit film is provided. The method includes providing at least one film layer having a polyester elastomer component; providing at least one film layer having a cycloaliphatic component; executing a means for communicating the at least one with the at least film layer comprising a polyester elastomer component with the at least one film layer comprising a cycloaliphatic component to create a multilayer film; printing and curing an electroconductive ink on at least one surface of at least one film layer of the substrate. The method further includes incorporating the stretchable printed circuit film into an article of manufacture. The article of manufacture can be a wearable device, a curved display, or a foldable electronic device.

DETAILED DESCRIPTION

Figure 1:
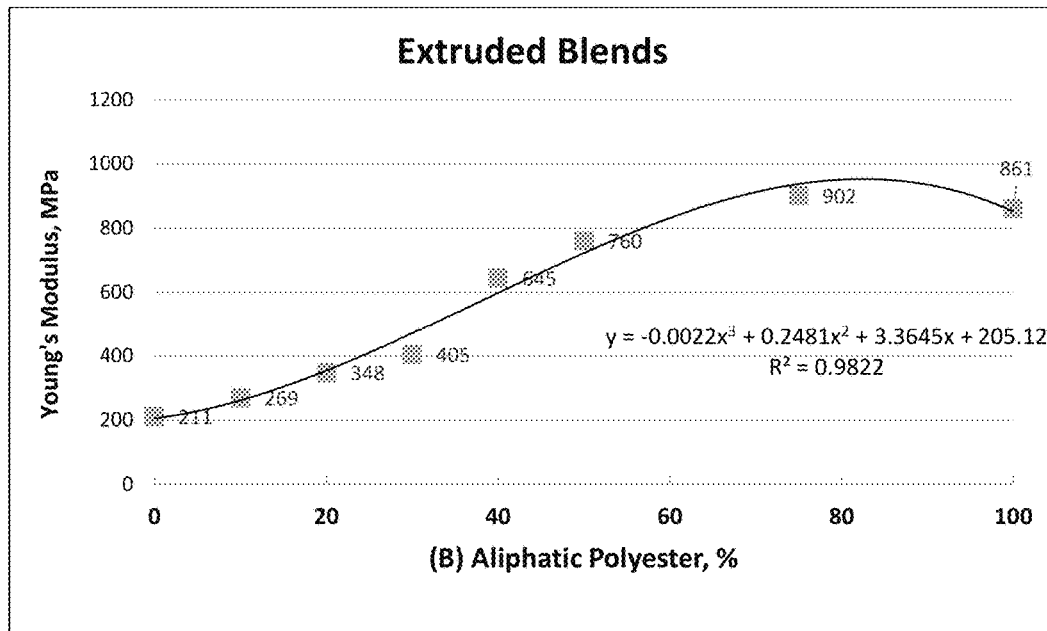
FIG. 1 illustrates Young's modulus of extruded blends as a function of aliphatic polyester with curve fitting.

Polymeric substrates with a wide range of modulus can be achieved by blending a polyester elastomer and an aliphatic polyester as taught by U.S. Pat. No. 7,297,755 which is hereby incorporated by reference in its entirety. Moduli can vary from about 200 MPa to about 900 MPa for extruded films and from about 300 MPa to about 1.3 GPa for biaxially oriented films. If a desired modulus of substrate is defined, it will be feasible to achieve the target modulus by using the empirical models for extruded, or biaxially oriented film, respectively. Biaxially/uniaxially oriented films provides down gauging, annealing, and optical advantages over extruded counterparts. All blends are miscible with high visible light transmittance and low haze. Its low refractive index matches well with coating, adhesive and glass for low iridescent displays. Substrates with high elongation are suitable for wearable devices, curved displays, and foldable electronics, which typically demand repeated stretchability. Annealed substrates enable high temperature curing of conductive inks or annealing of transparent conductive coatings.

It has been discovered that both excellent mechanical properties as well as electronic performance of polymeric substrates for use as a printed circuit film can be achieved by use of extruded and multilayer films incorporating combinations of polyester elastomer and/or aliphatic polymer in the substrate and printing and curing electroconductive ink onto the annealed substrate. Articles of manufacture, such as wearable device, a curved display, foldable electronic device, in-mold electronics, E-textiles, stretchable thin film transistors, and transparent conductive films can include the printed circuit film.

More particularly, it has been found that certain copolyesters, particularly cycloaliphatic polyesters and/or compositions of these polyesters with certain polyester elastomers containing one or more hard segments and one or more polyether or polyester-ether soft segments are useful for the preparation of films for use in substrates for printed circuits, the films having a combination of properties such as, for example, strength, toughness, soft feel, chemical resistance, thermal resistance and UV resistance.

Unless otherwise indicated, all numbers expressing quantities of ingredients, properties such as molecular weight, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention. At the very least, each numerical parameter should at least be construed in light of the number of reported significant digits and by applying ordinary rounding techniques. Further, the ranges stated in this disclosure and the claims are intended to include the entire range specifically and not just the endpoint(s). For example, a range stated to be 0 to 10 is intended to disclose all whole numbers between 0 and 10 such as, for example 1, 2, 3, 4, etc., all fractional numbers between 0 and 10, for example 1.5, 2.3, 4.57, 6.1113, etc., and the endpoints 0 and 10. Also, a range associated with chemical substituent groups such as, for example, "$C_1$ to $C_5$ hydrocarbons", is intended to specifically include and disclose $C_1$ and $C_5$ hydrocarbons as well as $C_2$, $C_3$, and $C_4$ hydrocarbons.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements.

The term "polyester", as used herein, is intended to include "copolyesters" and is understood to mean a synthetic polymer prepared by the polycondensation of one or more difunctional carboxylic acids with one or more difunctional hydroxyl compounds. The term "cycloaliphatic polyester", as used herein, means a polyester comprising a molar excess of the residues of cycloaliphatic dicarboxylic acids and/or cycloaliphatic diols. "Cycloaliphatic" as used herein with respect to the diols and dicarboxylic acids of the invention, refers to structures which contain as a backbone a cyclic arrangement of the constituent carbon atoms which may be saturated or paraffinic in nature, unsaturated, i.e., containing non-aromatic carbon-carbon double bonds, or acetylenic, i.e., containing carbon-carbon triple bonds. Typically, the difunctional carboxylic acid is a dicarboxylic acid and the difunctional hydroxyl compound is a dihydric alcohol such as, for example, glycols and diols.

In the present invention, the difunctional carboxylic acid typically is a cycloaliphatic dicarboxylic acid such as, for example, 1,4-cyclohexanedicarboxylic acid, and the difunctional hydroxyl compound may be cycloaliphatic diol such as, for example, 1,4-cyclohexanedimethanol. The term "residue", as used herein, means any organic structure incorporated into a polymer through a polycondensation reaction involving the corresponding monomer. The term "repeating unit", as used herein, means an organic structure having a dicarboxylic acid residue and a diol residue bonded through a carbonyloxy group. Thus, the dicarboxylic acid residues may be derived from a dicarboxylic acid monomer or its associated acid halides, esters, salts, anhydrides, or mixtures thereof. As used herein, therefore, the term dicarboxylic acid is intended to include dicarboxylic acids and any derivative of a dicarboxylic acid, including its associated acid halides, esters, half-esters, salts, half-salts, anhydrides, mixed anhydrides, or mixtures thereof, useful in a polycondensation process with a diol to make a high molecular weight polyester.

The cycloaliphatic polyesters used in the present invention typically are prepared from dicarboxylic acids and diols which react in substantially equal proportions and are incorporated into the polyester polymer as their corresponding residues. The cycloaliphatic polyesters of the present invention, therefore, contain substantially equal molar proportions of acid residues (100 mole %) and diol residues (100 mole %) such that the total moles of repeating units is equal to 100 mole %. The mole percentages provided in the present disclosure, therefore, may be based on the total moles of acid residues, the total moles of diol residues, or the total moles of repeating units. For example, a polyester containing 30 mole % 1,4-cyclohexane dicarboxylic acid (1,4-CHDA), based on the total acid residues, means that the polyester contains 30 mole % 1,4-CHDA residues out of a total of 100 mole % acid residues. Thus, there are 30 moles of 1,4-CHDA residues among every 100 moles of acid residues. In another example, a polyester containing 30 mole % 1,4-cyclohexanedimethanol (1,4-CHDM), based on the total diol residues, means that the polyester contains 30 mole % 1,4-CHDM residues out of a total of 100 mole % diol residues. Thus, there are 30 moles of 1,4-CHDM residues among every 100 moles of diol residues.

The cycloaliphatic polyester comprises about 98 to about 100 mole percent (abbreviated herein as "mole %"), based on the total diacid residues, of the residues of at least one diacid selected from the group consisting of 1,3-cyclohexane-dicarboxylic acid and 1,4-cyclohexanedicarboxylic acid. For example, the diacid may be 1,4-cyclohexanedicarboxylic acid. The 1,3- and 1,4-cyclohexanedicarboxylic acids may be used as their pure cis or trans isomers or as a mixture of cis and trans isomers. Cycloaliphatic acids having a high level of trans isomers (greater than 60 mole % trans) are generally preferred to provide higher glass transition temperatures.

The cycloaliphatic polyester of our invention also contains diol residues that may comprise about 70 to about 100 mole % of at least one reside selected from 1,3-cyclohexanedimethanol, 2,2,4,4-tetramethyl-1,3-cyclobutanediol, and 1,4-cyclohexane-dimethanol (abbreviated herein as "CHDM"). As used herein, the term "diol" is synonymous with the term "glycol" and means any dihydric alcohol. As with the diacids, cis, trans, and mixtures of cis, trans isomers of the glycols are intended to be included within the scope of the invention. For example, CHDM may be used as the pure cis or trans isomer or as a mixture of cis, trans isomers. High levels of trans isomers are generally preferred as described above for the diacids. In addition to cycloaliphatic diols, the cycloaliphatic polyester may also comprise and lesser amounts of aliphatic diols. For example, the cycloaliphatic polyester may comprise 0 to about 30 mole %, based on the total moles of diol residues, of the residues of at least one diol selected from of linear or branched, aliphatic diols containing 2 to about 16 carbon atoms. Typical examples of diols include ethylene glycol, 1,2-propanediol, 1,3-propanediol, 1,4-butanediol, 1,5-pentanediol, 1,6-hexanediol, 1,8-octanediol, 1,10-decanediol, neopentyl glycol, 2,2,4,4-tetramethyl-1,3-cyclobutanediol, 2,2,4-trimethyl 1,3-pentanediol, and the like. In another example, the diol residues of the polyester may comprise about 95 to about 100 mole %, based on the total diol residues, of the residues of 1,4-cyclohexanedimethanol. In a further example, the diacid may be 1,4-cyclohexanedicarboxylic acid and, in another example, the diol may be 1,4-cyclohexanedimethanol. In yet another example, the cycloaliphatic polyester may be poly(1,3-cyclohexylenedimethylene-1,3-cyclohexanedicarboxylate), poly(1,4cyclohexylenedimethylene-1,4-cyclohexanedicarboxylate), or poly(2,2,4,4-tetramethyl-1,3-cyclobutylene-1,4-cyclohexanedicarboxylate).

Although not essential to the invention, the cycloaliphatic polyester may comprise up to 2 mole percent, based on the total moles of diol or diacid residues, of the residues of one or more branching agents having 3 or more carboxyl substituents, hydroxyl substituents, ionic forming groups, or a combination thereof, to improve melt strength and processability. Examples of branching agents include, but are not limited to, multifunctional acids or glycols such as trimellitic acid, trimellitic anhydride, pyromellitic dianhydride, trimethylolpropane, glycerol, pentaerythritol, citric acid, tartaric acid, 3-hydroxyglutaric acid and the like. Examples of ionic forming groups include sodiosulfoisophthalic acid and sodiosulfobenzoic acid. In one example, the branching agent residues comprise about 0.1 to about 1 mole percent of one or more residues of: trimellitic anhydride, pyromellitic dianhydride, glycerol, sorbitol, 1,2,6-hexanetriol, pentaerythritol, trimethylolethane, or trimesic acid. The branching agent may be added to the polyester reaction mixture or blended with the polyester in the form of a concentrate as described, for example, in U.S. Pat. No. 5,654,347.

The polyesters of the present invention have an inherent viscosity of about 0.5 to about 1.5 dL/g. The inherent viscosity, abbreviated herein as "I.V.", refers to inherent viscosity determinations made at 25° C. using 0.25 gram of polymer per 50 mL of a solvent composed of 60 weight percent phenol and 40 weight percent tetrachloroethane. Other examples of I.V. values which may be exhibited by the polyester compositions are about 0.6 to about 1.2 dL/g, about 0.7 to about 1.1 dL/g.

The term "polyester elastomer", as used herein, is understood to mean any polyester having a low modulus of about 1 to 500 megaPascals (MPa) (at room temperature) which easily undergoes deformation and exhibits reversible elongations, under small applied stresses, i.e., elasticity. By the term "reversible", as used herein, it is meant that the polyester returns to its original shape after any applied stress is removed. In general, these are prepared by conventional esterification/polycondensation processes from (i) one or more diols, (ii) one or more dicarboxylic acids, (iii) one or more long chain ether glycols, and optionally, (iv) one or more lactones or polylactones. For example, the polyester elastomer of the present invention may comprise (i) diacid residues comprising the residues of one or more diacids selected from substituted or unsubstituted, linear or branched aliphatic dicarboxylic acids containing 2 to 20 carbon atoms, substituted or unsubstituted, linear or branched cycloaliphatic dicarboxylic acids containing 5 to 20 carbon atoms, and substituted or unsubstituted aromatic dicarboxylic acids containing 6 to 20 carbon atoms; and (ii) diol residues comprising the residues of one or more substituted or unsubstituted, linear or branched, diols selected from aliphatic diols containing 2 to 20 carbon atoms, poly (oxyalkylene)-glycols and copoly-(oxyalkylene)glycols having an average molecular weight of about 400 to about 12000, cycloaliphatic diols containing 5 to 20 carbon atoms, and aromatic diols containing 6 to 20 carbon atoms. Representative dicarboxylic acids which may be used to prepare the polyester elastomer include, but are not limited to, 1,4-cyclohexanedicarboxylic acid; 1,3-cyclohexanedicarboxylic acid; terephthalic acid; isophthalic acid; sodiosulfoisophthalic acid; adipic acid; glutaric acid; succinic acid; azelaic acid; dimer acid; 2,6-naphthalene-dicarboxylic acid, and mixtures thereof. Preferred aliphatic acids include 1,4-cyclohexanedicarboxylic acid, sebacic acid, dimer acid, glutaric acid, azelaic acid, adipic acid, and mixtures thereof. Cycloaliphatic dicarboxylic acids such as, for example, 1,4-cyclohexanedicarboxylic acid may be present as the pure cis or trans isomer or as a mixture of cis and trans isomers. Preferred aromatic dicarboxylic acids include terephthalic, phthalic and isophthalic acids, sodiosulfoisophthalic, and 2,6-naphthalene-dicarboxylic acid, and mixtures thereof.

The polyester elastomer also may comprise the residues of at least one diol. Examples of diols include ethylene glycol; 1,3-propanediol; 1,4-butanediol; 1,5-pentanediol; 2-methylpropanediol; 2,2-dimethylpropanediol; 1,6-hexanediol; decanediol; 2,2,4,4-tetramethyl-1,3-cyclobutanediol; 1,3-cyclohexanedimethanol; 1,4-cyclohexanedimethanol; poly(ethylene ether)glycol; poly(propylene ether) glycol; and poly(tetramethylene ether)glycol. For example, the polyester elastomer may comprise the residues of a poly(oxyalkylene)glycol such as, for example, a poly(tetramethylene ether)glycol having an average molecular weight of about 400 to about 2000 Although not required, the polyester elastomer may comprise the residues of a branching agent having 3 or more carboxyl substituents, hydroxyl substituents, or a combination thereof. Examples of branching agents include, but are not limited to, multifunctional acids or glycols such as trimellitic acid, trimellitic anhydride, pyromellitic dianhydride, trimethylolpropane, glycerol, pentaerythritol, citric acid, tartaric acid, 3-hydroxyglutaric acid and the like. Examples of branching agent levels within the polyester elastomer are about 0.1 to about 2 mole %, about 0.1 to about 1 mole % and 0.5 to about 1 mole %, based on the total moles of diacid or diol residues.

In a further embodiment, the polyester elastomers of the present invention may comprise at least 90 mole %, based on the total moles of diacid residues, of the residues of at least one diacid selected from 1,4-cyclohexanedicarboxylic acid and terephthalic acid; about 2 to about 30 mole %, based on the total diol residues, of a poly(tetramethylene ether)glycol having an average molecular weight of about 400 to about 2000, and about 98 to about 70 mole %, based on the total diol residues, of the residues of at least one diol selected from the group consisting of 1,4-cyclohexanedimethanol and 1,4-butanediol; and about 0.1 to about 2 mole %, based on the total diacid residues, of the residues of at least one branching agent selected from the group consisting of trimellitic acid, trimellitic anhydride, and pyromellitic dianhydride. In yet another example, the polyester elastomer also may comprise at least 95 mole %, based on the total moles of diacid residues, of the residues of 1,4-cyclohexanedicarboxylic acid; and about 98 to about 70 mole %, based on the total diol residues, of the residues of 1,4-cyclohexanedimethanol. Examples of commercially available polyester elastomers which may be used in the polyester composition of the present invention include ECDEL® polyester elastomers (available from Eastman Chemical Company) and HYTREL® polyester elastomers (available from DuPont Company). In some cases, it may be desirable to use mixtures of the HYTREL®, and ECDEL® polyester elastomers with the cycloaliphatic polyester.

In addition, the polyester elastomers may have incorporated therein one or more lactones or polylactones. Lactones suitable herein are widely available commercially, e.g., Union Carbide Corporation and Aldrich Chemicals. While epsilon caprolactone is especially preferred, it is also possible to use substituted lactones wherein the lactone is substituted by a lower alkyl group such as a methyl or ethyl group at the alpha, beta, gamma, delta, or epsilon positions. Additionally, it is possible to use polylactone, including homopolymers and copolymers thereof with one or more components, as well as hydroxy terminated polylactone, as block units in these poly(ether esters).

The cycloaliphatic polyesters and the polyester elastomers of the instant invention are readily prepared from the appropriate dicarboxylic acids, esters, anhydrides, or salts, the appropriate diol or diol mixtures, and optional branching agents using typical poly-condensation reaction conditions. They may be made by continuous, semi-continuous, and batch modes of operation and may utilize a variety of reactor types. Examples of suitable reactor types include, but are not limited to, stirred tank, continuous stirred tank, slurry, tubular, wiped-film, falling film, or extrusion reactors. The term "continuous" as used herein means a process wherein reactants are introduced and products withdrawn simultaneously in an uninterrupted manner. By "continuous" it is meant that the process is substantially or completely continuous in operation in contrast to a "batch" process. "Continuous" is not meant in any way to prohibit normal interruptions in the continuity of the process due to, for example, start-up, reactor maintenance, or scheduled shut down periods. The term "batch" process as used herein means a process wherein all the reactants are added to the reactor and then processed according to a predetermined course of reaction during which no material is fed or removed into the reactor. The term "semicontinuous" means a process where some of the reactants are charged at the beginning of the process and the remaining reactants are fed continuously as the reaction progresses. Alternatively, a semicontinuous process may also include a process similar to a batch process in which all the reactants are added at the beginning of the process except that one or more of the products are removed continuously as the reaction progresses. The process is operated advantageously as a continuous process for economic reasons and to produce superior coloration of the polymer as the polyester may deteriorate in appearance if allowed to reside in a reactor at an elevated temperature for too long a duration.

The cycloaliphatic polyesters and polyester elastomers of the present invention are prepared by procedures known to persons skilled in the art. The reaction of the diol, dicarboxylic acid, and optional branching agent components may be carried out using conventional polyester polymerization conditions. For example, when preparing the cycloaliphatic polyester or polyester elastomer by means of an ester interchange reaction, i.e., from the ester form of the dicarboxylic acid components, the reaction process may comprise two steps. In the first step, the diol component and the dicarboxylic acid component, such as, for example, dimethyl terephthalate, are reacted at elevated temperatures, typically, about 150° C. to about 250° C. for about 0.5 to about 8 hours at pressures ranging from about 0.0 kPa gauge to about 414 kPa gauge (60 pounds per square inch, "psig"). Preferably, the temperature for the ester interchange reaction ranges from about 180° C. to about 230° C. for about 1 to about 4 hours while the preferred pressure ranges from about 103 kPa gauge (15 psig) to about 276 kPa gauge (40 psig). Thereafter, the reaction product is heated under higher temperatures and under reduced pressure to form the polyester with the elimination of diol, which is readily volatilized under these conditions and removed from the system. This second step, or poly-condensation step, is continued under higher vacuum and a temperature which generally ranges from about 230° C. to about 350° C., preferably about 250° C. to about 310° C. and, most preferably, about 260° C. to about 290° C. for about 0.1 to about 6 hours, or preferably, for about 0.2 to about 2 hours, until a polymer having the desired degree of polymerization, as determined by inherent viscosity, is obtained. The polycondensation step may be conducted under reduced pressure which ranges from about 53 kPa (400 torr) to about 0.013 kPa (0.1 torr). Stirring or appropriate conditions are used in both stages to ensure adequate heat transfer and surface renewal of the reaction mixture. The reaction rates of both stages are increased by appropriate catalysts such as, for example, alkoxy titanium compounds, alkali metal hydroxides and alcoholates, salts of organic carboxylic acids, alkyl tin compounds, metal oxides, and the like. A three-stage manufacturing procedure, similar to that described in U.S. Pat. No. 5,290,631, may also be used, particularly when a mixed monomer feed of acids and esters is employed.

To ensure that the reaction of the diol component and dicarboxylic acid component by an ester interchange reaction is driven to completion, it is sometimes desirable to employ about 1.05 to about 2.5 moles of diol component to one mole dicarboxylic acid component. Persons of skill in the art will understand, however, that the ratio of diol component to dicarboxylic acid component is generally determined by the design of the reactor in which the reaction process occurs.

In the preparation of cycloaliphatic polyester or polyester elastomer by direct esterification, i.e., from the acid form of the dicarboxylic acid component, polyesters are produced by reacting the dicarboxylic acid or a mixture of dicarboxylic acids with the diol component or a mixture of diol components and the optional branching agent component. The reaction is conducted at a pressure of from about 7 kPa gauge (1 psig) to about 1379 kPa gauge (200 psig), preferably less than 689 kPa (100 psig) to produce a low molecular weight polyester product having an average degree of polymerization of from about 1.4 to about 10. The temperatures employed during the direct esterification reaction typically range from about 180° C. to about 280° C., more preferably ranging from about 220° C. to about 270° C. This low molecular weight polymer may then be polymerized by a polycondensation reaction.

The cycloaliphatic polyester and polyester elastomer may exist as a compatible blend or a miscible blend and may be present in a broad range of blend ratios/weight percentages based on the total weight of the article. More than one cycloaliphatic polyester and/or polyester elastomer may be used as needed to obtain the desired properties of the film. For example, the film may comprise about 5 to about 100 weight percent of one or more cycloaliphatic polyesters and from 0 to about 95 weight percent of one or more polyester elastomers, based on the total weight of the film. In another example, the film comprises about 5 to about 95 wt % of one or more cycloaliphatic polyesters and about 5 to about 95 wt % of one or more cycloaliphatic polyester elastomers. In yet another example, the film may comprise about 30 to about 100 weight percent cycloaliphatic polyester and 0 to 70 weight percent polyester elastomer. Other examples of weight percentages of the cycloaliphatic polyester and polyester elastomer include, but are not limited to, about 90 to about 100 weight percent cycloaliphatic polyester and 0 to 10 weight percent polyester elastomer, and about 30 to about 50 weight percent cycloaliphatic polyester and 50 to 70 weight percent polyester elastomer. Additional specific examples of compositions are about 10 wt % cycloaliphatic polyester and about 90 wt % polyester elastomer; about 20 wt % cycloaliphatic polyester and about 80 wt % polyester elastomer; about 60 wt % cycloaliphatic polyester and about 40 wt % polyester elastomer and about 80 wt % cycloaliphatic polyester, and about 20 wt % polyester elastomer; and about 90 wt % cycloaliphatic polyester and about 10 wt % polyester elastomer.

In a further example, the film of the instant invention comprises about 5 to about 95 wt % of poly(1,4 cyclohexylenedimethylene 1,4-cyclohexane-dicarboxylate), abbreviated herein as "PCCD", as the cycloaliphatic polyester and about 95 to about 5 wt % of a polyester elastomer comprising at least 95 mole %, based on the total moles of diacid residues, of residues of 1,4-cyclohexanedicarboxylic acid; and about 98 to about 70 mole %, based on the total diol residues, of residues of 1,4-cyclohexane-dimethanol. In this embodiment, for example, the polyester elastomer can comprise poly(1,4 cyclohexylenedimethylene 1,4-cyclohexanedicarboxylate) copolymerized with with about 2 to about 30 mole % of PTMEG having an average molecular weight of about 400 to about 2000 (abbreviated herein as "PCCE"). The polyester elastomer also may comprise from about 0.1 to about 2 mole %, based on the total diacid residues, of the residues of a trimellitic acid or anhydride as a branching agent. PCCD has a glass transition temperature Tg of about 65° C., whereas the polyester elastomer is a soft elastomer having a Tg below room temperature (about −3° C.). In oriented films, PCCD has a modulus that is about half that of typical biaxially oriented PET film (e.g. Mylar™) or fiber, thus giving it a softer feel. The Tg of the miscible blend will fall roughly linearly between the cycloaliphatic polyester and the polyester elastomer, because both polymers have similar structures. The modulus of the article will also vary with the composition of the article.

The cycloaliphatic polyesters and polyester elastomers are resistant to chemical and UV attack and impart additional stiffness and processability in comparison with substantially linear aliphatic polyesters. Because of this resistance, the film also will be resistant to UV and chemical attack over the entire compositional range of cycloaliphatic polyester and polyester elastomer. Thus, the level of polyester elastomer can be varied depending on the tactile and toughness related end-use desired for the film. At high levels (above about 30 wt %), for example, the polyester elastomer significantly softens the article to the point that it is flexible at room temperature and feels similar to an olefin or plasticized PVC. For example, the combination of PCCD and PCCE gives a film that is softer and tougher than PCCD alone, but is more easily processed and oriented in comparison to PCCE alone. Orientation further creates a film that can be further thermally stabilized by heatsetting. Because these polyester compositions may be strain-crystallized and heatset, the articles can exhibit excellent properties over a much broader temperature range than other traditional soft feel resins like plasticized PVC, polyolefins and the like.

The films of the invention may comprise articles of manufacture. Exemplary articles include a wearable device, a curved display, or a foldable electronic device. Although the cycloaliphatic polyester and, hence, the film, is inherently stable to UV light, small amount of a hindered amine light stabilizer (HALS) may be added to the cycloaliphatic polyester or to the composition to scavenge radicals formed during the extrusion process or by photodegradation initiated from UV absorption by impurities that may be found in the cycloaliphatic polyester or polyester elastomer. Examples of HALS that may be used for this purpose include CHIMMASORB® 119, CHIMMASORB® 944, TINUVIN® 770, and others available from Ciba Specialty Chemicals and CYASORB® UV-3529 and CYASORB® UV-3346 available from Cytec Industries. HALS are usually used at levels of 0.1 to 1 weight percent. Additionally, some UV absorbing additive may also be added to the composition if the film is to be used as a protective layer over another surface. Examples of effective UV absorbers are: benzophenones such as TINUVIN® 81, CYASORB® UV-9, CYASORB® UV-24, and CYASORB® UV-531; benzotriazoles such as TINUVIN® 213, TINUVIN® 234, TINUVIN® 320, TINUVIN® 360, CYASORB® UV-2337, and CYASORB® UV-5411; and triazines such as TINUVIN® 1577, and CYASORB® 1164. For the polyester elastomer, one or more oxidative stabilizers may be used in some instances to retard the breakdown of any polyester residues, if present. Examples of stabilizers that may be used for this purpose include hindered phenol stabilizers such as IRGANOX® 1010 and IRGANOX® 1076, which are typically used at levels of about 0.1 to about 1 weight percent.

The cycloaliphatic polyester and polyester elastomer may be dry blended or melt mixed in a single or twin screw extruder or in a Banbury Mixer. For example, unoriented films may be prepared by the traditional methods such as chill roll casting, calendering, melt blowing, die extruding, injection molding, spinning, etc. For example, the high melt strength of the polyester elastomer will make the calendering of films at lower temperatures easier. Direct extrusion from the reactor as is common with many fiber operations is also possible. For example, in a typical procedure for preparing film, the melt is extruded through a slotted die using melt temperatures of about 200 to 280° C. and then cast onto a chill roll at about 20° C. to about 100° C. (70° F. to 210° F.). The optimal casting temperature will vary depending on the amount of elastomer in the composition. The formed film can have a nominal thickness of anywhere from about 5 to 300 mils depending on the final desired thickness of the film after stretching. Another typical thickness range is 10 to 100 mils.

The films of the invention may be oriented by various techniques known to persons skilled in the art and depending on the nature of the article. For example, film, may be uniaxially or biaxially stretched using one or more of the following techniques: machine direction oriented ("MDO") drafting, tentering, double bubble stretching, compression enhanced stretching, compression molding, solid-state extrusion, and the like. Stretching is usually performed at or near the glass transition temperature Tg, of the polyester. A typical temperature range for stretching is from about Tg+5° C. to about Tg+30° C. (Tg+10° F. to Tg+60° F.); higher stretch temperatures may used for faster stretch rates.

The level of orientation in the film can be quantified by optical birefringence. Birefringence is the difference in refractive index between any two of the three principal directions in the material. These directions are the machine direction (MD or x), transverse direction (TD or y) and the thickness direction (ND or z) for a film. Thus, there are 3 values of birefringence: $(n_x-n_y)$, $(n_y-n_z)$ and $(n_x-n_z)$ although only two of these are independent. The birefringence is effectively a measure of the difference in orientation between these two directions. A birefringence of zero indicates no difference in orientation between the respective directions. If all three values of the birefringence close to zero, then the article is unoriented, as for example with a cast film.

The nominal refractive index for the unoriented cycloaliphatic polymers of the present invention is approximately 1.510 (at a wavelength of 632 nm). For a highly oriented film, the maximum birefringence is typically about 0.02 to about 0.03. This low variation in birefringence with these cycloaliphatic polyesters can be advantageous in optical applications where the in-plane refractive indices need to be constant in all directions (to prevent unwanted polarization or distortion). For example, in an equi-biaxially oriented film, the refractive index in the MD and TD direction should be the same, while the thickness direction refractive index will be much lower (due to the relative orientation). Variations in process, however, will result in slight variations in the MD and TD refractive indices. For an aromatic polymer, these variations can be large enough to cause visual distortions. In contrast, for the film of the present invention, the difference in MD and TD refractive indices will always remain small thereby causing fewer distortions.

Typically, the oriented films of the instant invention have at least one birefringence greater than about 0.005. In another example, the films of the invention may have at least one birefringence greater than about 0.01. For most films (particularly equi-biax), this maximum birefringence will usually be the (MD-thickness) or (TD-thickness).

The film may be heatset depending on the end use requirements. Heatsetting will normally impart thermal stability to article in order to prevent shrinkage at higher temperatures. It is accomplished by constraining the film while heating to temperatures from about 125° C. to 200° C. and is well known, for example, in the film and fiber industries. Usually some relaxation is allowed during heatsetting (about 5 to 10%) to reduce stress. Residence time in the heatset oven can be as little as a few seconds to a few minutes depending on oven sizes, line speed, and other factors. Typical heatsetting temperatures are 170° C. to 210° C.

Films can also be processed using other techniques well known in the art. For example, films can be embossed or otherwise engraved using appropriate compression or casting rolls. Lenticular films for graphic arts applications are particularly useful with the present invention where outdoor UV stability or chemical resistance are required. Lower density films can be produced through the addition of foaming agents (chemical or gas) or voiding agents. For example, films may be a microvoided through by blending in voiding agents, i.e., small amounts of particles or incompatible polymers which form voids on stretching. This process is called "voiding" and may also be referred to as "cavitating" or "microvoiding". Voids are obtained by incorporating about 5 to about 50 weight % of small organic or inorganic particles or "inclusions" (referred in the art as "voiding" or "cavitation" agents) into a matrix polymer and orienting the polymer by stretching in at least one direction. During stretching, small cavities or "microvoids" are formed around the voiding agent.

The films of the present invention may comprise one or more layers. When the film comprises multiple layers, it will have layers in communication with each other which can be achieved by methods such as coextrusion, lamination, microlayer coextrusion and the like as known in the art. Further, the multiple layers can be arranged in any order desirable, including, for example, layering arrangements such as polyester elastomer/cycloaliphatic, polyester elastomer/cycloaliphatic/polyester elastomer, or cycloaliphatic/polyester elastomer/cycloaliphatic. The film may, for example, comprise a plurality of layers, wherein at least one layer has a thickness of 1 μm or less. In particular, especially when utilizing microlayer coextrusion technology the films may be formed of a plurality of "microlayers". In such films, up to many hundreds or thousands of layers of two or more alternating, dissimilar layers are coextruded together using special die technology. The layers may be chosen for various reasons including achieving refractive indices that are significantly different, to maximize internal reflectance and enhance the pearlescent, iridescent look of the film.

Whether single or multiple layers, the films of the present invention comprise an electroconductive ink printed on the substrate. Suitable inks include Ag, Carbon, Cu, CNT, graphene, PEDOT, AgNW, and the like. Suitable methods of printing the ink include screen printing, ink jet, gravure offset, photo-patterning, hybrid, 3D printing and the like.

EXAMPLES

In the following Examples, the polymer blends are composed of a polyester elastomer (A) and an aliphatic polyester (B). The blending ratio of polymer (B) ranges from 0-100 wt %.

(A) Polyester elastomer composition: 100 mole % DMCD 0.5 mole % TMA 90.6 mole % CHDM 8.9 mole % PTMEG (B) Aliphatic polyester composition: 100 mole % DMCD100 mole % CHDM where DMCD=dimethyl 1,4-cyclohexanedicarboxylate
TMA=trimellitic anhydride
PTMEG=poly(tetramethylene ether) glycol
CHDM=1,4-cyclohexanedimethanol Examples 1-8

Samples were produced by melt processing from blends of (A) polyester elastomer and (B) aliphatic polyester. Both materials were dried prior to extrusion. The blends were prepared by pellet-pellet mixing of two materials (Table 1). The blends were then fed into a cast film extrusion line to produce 250 μm thick films. As shown in Table 1, there is some crystallinity in each sample since (A) polyester elastomer is ready to crystallize during extrusion. 100% (B) aliphatic polyester however has zero crystallinity.

TABLE 1

A/B blend ratios for extruded sample with measured crystallinity by DSC.

| EX # | A (polyester elastomer) | B (aliphatic polyester) | Extrusion Melt Temperature, ° C. | Crystallinity, % |
|---|---|---|---|---|
| 1 | 100 | 0 | 250 | 22.9 |
| 2 | 90 | 10 | 250 | 25.4 |
| 3 | 80 | 20 | 250 | 25.3 |
| 4 | 70 | 30 | 240 | 24.7 |
| 5 | 60 | 40 | 240 | 27.5 |
| 6 | 50 | 50 | 235 | 23.9 |
| 7 | 25 | 75 | 230 | 19.1 |
| 8 | 0 | 100 | 230 | 0 |

The optical properties of the extruded samples are illustrated in Table 2. All samples are transparent with more than 90% visual light transmittance (VLT).

TABLE 2

Optical properties of extruded samples.

| EX # | L* | a* | b* | % Haze | VLT, % |
|---|---|---|---|---|---|
| 1 | 96.667 | −0.039 | 0.715 | 0.96 | 91.63 |
| 2 | 96.097 | −0.026 | 0.714 | 0.66 | 90.24 |
| 3 | 96.089 | −0.033 | 0.611 | 0.50 | 90.15 |
| 4 | 96.134 | −0.029 | 0.577 | 0.64 | 90.33 |
| 5 | 96.340 | −0.019 | 0.543 | 1.09 | 90.83 |
| 6 | 96.147 | −0.101 | 0.511 | 1.32 | 90.36 |
| 7 | 96.152 | −0.006 | 0.488 | 1.50 | 90.37 |
| 8 | 96.166 | −0.005 | 0.356 | 3.68 | 90.41 |

L = lightness; a = green-red; b = blue-yellow color space; Haze = is the scattering of light (ASTM D100); and VLT = the amount of light that passes through a sample.

The tensile properties of as extruded samples are shown in Table 3. Samples with high elastomer content have greater elongation at break. Most importantly, the modulus can be increased with increasing aliphatic polyester content while maintaining good optical properties due to excellent miscibility.

TABLE 3

Tensile properties of extruded samples.

Tensile Test ASTM D882

| EX # | Yield strength (MPa) | Break strength (MPa) | Elongation at break % | Modulus (MPa) |
|---|---|---|---|---|
| 1 | 12.0 | 23.3 | 661 | 211 |
| 2 | 13.6 | 24.6 | 573 | 269 |
| 3 | 15.4 | 28.1 | 598 | 348 |
| 4 | 16.0 | 25.4 | 566 | 405 |
| 5 | 23.1 | 31.0 | 502 | 645 |
| 6 | 27.2 | 28.1 | 470 | 760 |
| 7 | 34.4 | 23.2 | 288 | 902 |
| 8 | 37.7 | 25.0 | 88 | 861 |

By plotting the modulus data in Cartesian coordinate, a non-linear regression model can be obtained as shown in FIG. 1. For extruded samples, its modulus can be estimated by Equation (1):

$$E=-0.0022x^3+0.2481x^2+3.3645x+205.12 \quad (1)$$

where E is tensile modulus, MPa. x is the wt % of B, aliphatic polyester.

Equation (1) allows the design of proper blend ratio to achieve a desired modulus that is compatible with conductive inks or electronic components such as TFT (thin-film-transistor).

Examples 9-16

Examples 1-8 (corresponding individually to Examples 9-16) samples were then stretched on the Brükner Karo IV film stretcher available from Brükner in Siegsdorf Germany to produce biaxially oriented films, which were stretched simultaneously in the machine direction and the transverse direction. Table 4 shows the extruded films with various blend ratios of Ecdel 9966 polyester elastomer available from Eastman Chemical/PCCD 19972 aliphatic polyester available from Eastman Chemical Company along with the corresponding stretch conditions. Samples were heated in a hot air oven at 70° C. or 80° C. for 30 seconds and stretched 3×3 (MD×TD) with a strain rate of 100%. The strain rate of 100% means doubling its original dimension in 1 second. Since the extruded film has a nominal thickness of 10 mil, the biaxially oriented film has a nominal thickness just over 1 mil after stretching. Blends with high Ecdel content crystallize readily to mid-twenties in % crystallinity as extruded (Table 1). The biaxial stretching does not induce further crystallization (Table 4). On the other hand, extruded PCCD sheet has little crystallinity and its crystallinity increases over 10% after biaxial stretching.

TABLE 4

A/B blends biaxially oriented conditions and corresponding crystallinity after stretching by DSC.

| EX # | A | B | Stretching conditions | Crystallinity, % |
|---|---|---|---|---|
| 9 | 100 | 0 | 3 × 3, 70° C., 100%, 30 sec. | 22.5 |
| 10 | 90 | 10 | 3 × 3, 70° C., 100%, 30 sec. | 24.0 |
| 11 | 80 | 20 | 3 × 3, 70° C., 100%, 30 sec. | 23.8 |
| 12 | 70 | 30 | 3 × 3, 70° C., 100%, 30 sec. | 25.1 |
| 13 | 60 | 40 | 3 × 3, 70° C., 100%, 30 sec. | 26.9 |
| 14 | 50 | 50 | 3 × 3, 70° C., 100%, 30 sec. | 26.1 |
| 15 | 25 | 75 | 3 × 3, 70° C., 100%, 30 sec. | 28.9 |
| 16 | 0 | 100 | 3 × 3, 80° C., 100%, 30 sec. | 13.6 |

Table 5 shows the optical properties of biaxially oriented blends. Biaxially oriented samples have much lower haze than extruded samples, mainly due to gauge reduction and surface leveling after stretching.

TABLE 5

Optical properties of biaxially oriented samples.

| EX # | Optical | | | | |
|---|---|---|---|---|---|
| | L* | a | b* | % Haze | VTL, % |
| 9 | 96.247 | −0.160 | 0.317 | 0.71 | 90.60 |
| 10 | 96.206 | 0.002 | 0.275 | 0.57 | 90.50 |
| 11 | 96.088 | −0.013 | 0.273 | 1.04 | 90.22 |
| 12 | 96.123 | 0.002 | 0.26 | 0.42 | 90.31 |
| 13 | 96.238 | 0.006 | 0.223 | 0.67 | 90.58 |

TABLE 5-continued

Optical properties of biaxially oriented samples.

| EX # | Optical | | | | |
|---|---|---|---|---|---|
| | L* | a | b* | % Haze | VTL, % |
| 14 | 96.220 | −0.001 | 0.209 | 0.45 | 90.54 |
| 15 | 96.286 | 0.008 | 0.214 | 0.36 | 90.70 |
| 16 | 96.217 | 0.006 | 0.161 | 0.20 | 90.53 |

Table 6 displays the tensile properties of biaxially oriented blends. The modulus ranges from 300 to 1300 MPa. The differences in mechanical properties between as extruded and biaxially oriented samples are significant. In general, biaxial orientation enhances the strength and modulus but reduces the elongation.

TABLE 6

Tensile properties of biaxially oriented blends.

| | Tensile Test ASTM D882 | | | |
|---|---|---|---|---|
| EX # | Yield strength (MPa) | Break strength (MPa) | Elongation at break % | Modulus (MPa) |
| 9 | 22.4 | 56.2 | 294 | 293 |
| 10 | 48.0 | 67.2 | 176 | 419 |
| 11 | 45.4 | 68.3 | 165 | 532 |
| 12 | 33.9 | 66.3 | 192 | 649 |
| 13 | 33.3 | 78.0 | 146 | 971 |
| 14 | 38.8 | 86.8 | 135 | 1122 |
| 15 | 49.7 | 94.1 | 85 | 1295 |
| 16 | 49.8 | 78.6 | 55 | 1273 |

Figure 2:
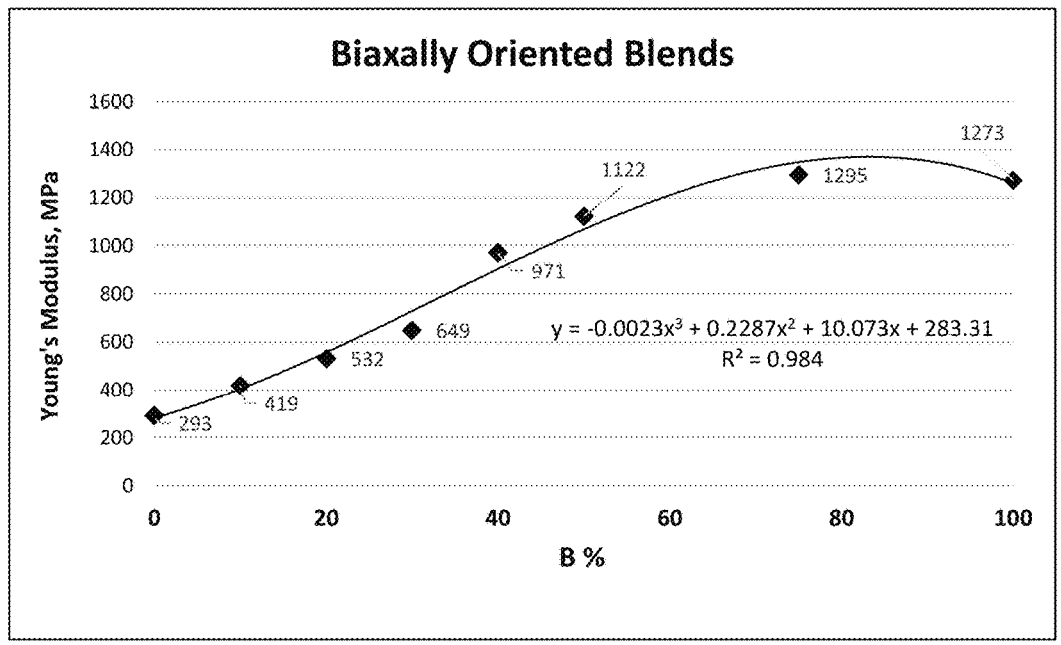
FIG. 2 illustrates Young's modulus of biaxially oriented blends as a function of aliphatic polyester with curve fitting.

By plotting the modulus data versus B wt % in Cartesian coordinate, a non-linear regression model can be obtained as shown in FIG. 2. For biaxially oriented samples, its modulus can be estimated by Equation (2):

$$E=-0.0023x^3+0.2287x^2+10.073x+283.31 \quad (2)$$

where E is tensile modulus, MPa.
x is the wt % of B, aliphatic polyester.

Equation (2) allows the design of proper blend ratio to achieve a desired modulus that is compatible with electronic components.

In addition to pellet-pellet blending, another approach to vary the modulus is by co-extrusion. Table 7 demonstrates that co-extrusion is also very viable in changing the modulus by varying the thickness ratio of fixed total thickness.

TABLE 7

Tensile modulus and optical properties of co-extruded samples of various layer thicknesses.

| EX # | Thickness Ratio B %/A %/B % | Tensile Modulus MPa | Optical | | | % Haze | VTL, % |
|---|---|---|---|---|---|---|---|
| | | | L | a | b | | |
| 9 | 0/100/0 | 211 | 96.247 | −0.160 | 0.317 | 0.71 | 90.60 |
| 17 | 10/80/10 | 426 | 97.124 | 0.020 | 0.430 | 0.87 | 92.75 |
| 18 | 15/70/15 | 692 | 97.176 | 0.026 | 0.346 | 0.54 | 92.87 |
| 19 | 20/60/20 | 815 | 97.233 | 0.023 | 0.305 | 0.66 | 92.99 |
| 16 | 50/0/50 | 861 | 96.217 | 0.006 | 0.161 | 0.20 | 90.53 |

Figure 3:
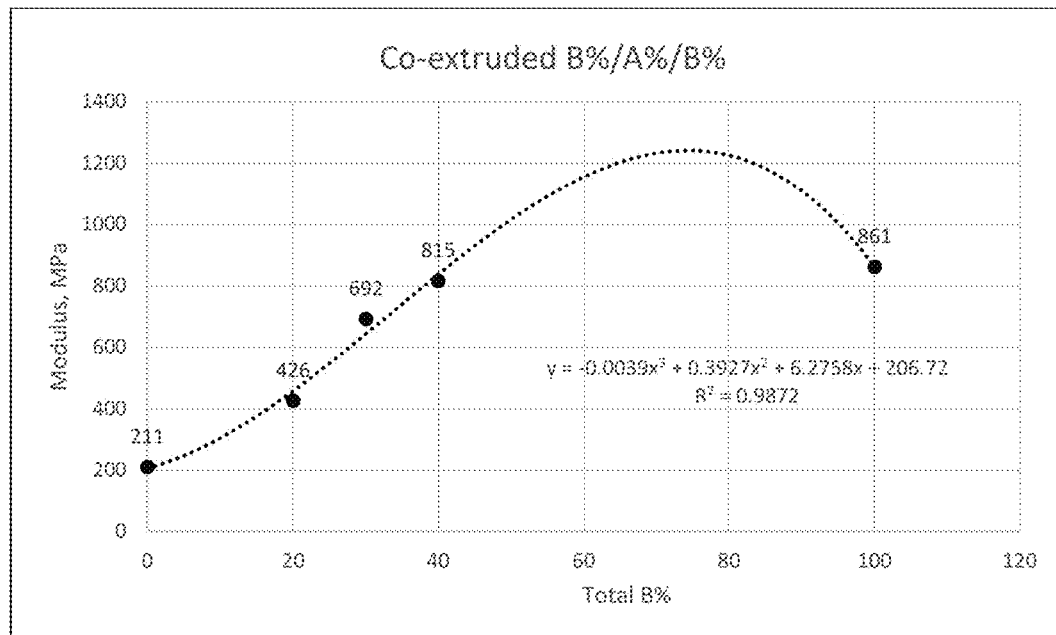
FIG. 3 illustrates Tensile modulus of co-extruded structures versus the total thickness ratio of cycloaliphatic layers.

By plotting the tensile modulus data versus the total B % in Cartesian coordinate, a non-linear regression model can be obtained as shown in FIG. 3. For co-extruded samples, its modulus can be estimated by Equation (3):

$$E=-0.0039x^3+0.3927x^2+6.2758x+206.72 \quad (3)$$

where
E is tensile modulus, MPa.
x is the total layer thickness % of B layers, aliphatic polyester.

Equation (3) allows the design of proper blend ratio to achieve a desired modulus that is compatible with electronic components.

Generally speaking, the higher the surface energy, the easier it is for substrates to form acceptable adhesion with conductive inks. Table 8 illustrates the surface energy of key components A & B. Both substrates and their compatible blends are compatible for printing directly with conductive inks.

TABLE 8 surface energy of Examples 9 and 16

| EX # | | Dispersive dyne/cm) | Polar (dyne/cm) | Total (dyne/cm) |
|---|---|---|---|---|
| 9 | 100% A | 36.5 | 6.3 | 42.8 |
| 16 | 100% B | 43.0 | 2.2 | 45.2 |

Figure 4:
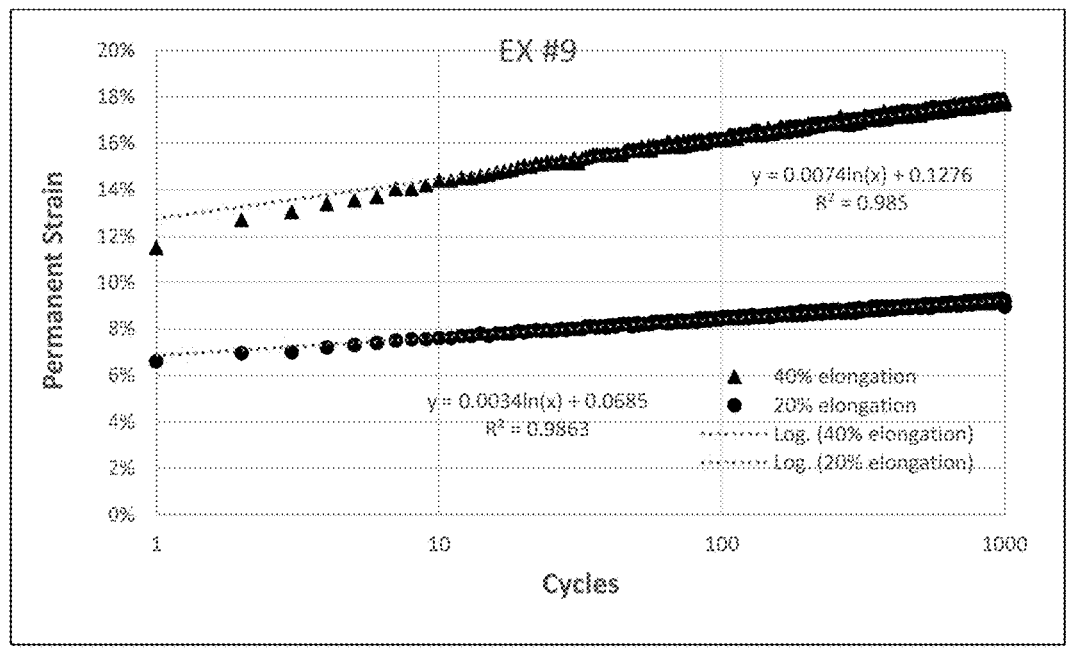
FIG. 4 illustrates Permanent strain up to 1000 cycles at a constant elongation for Example 9.

In addition to the modulus match between substrate and electronic components, interconnects have to maintain functional after the entire circuit is subject to repeated stretching at a certain elongation. FIG. 4 shows the permanent strain of Example 9 versus the number of stretching at 20% and 40% elongation, respectively.

For 20% elongation, $$\varepsilon = 0.0034 * \ln(n) + 0.0685 \quad (4)$$

where ε is permanent strain
n is the number of cycles at 20% elongation.

For 40% elongation, $$\varepsilon = 0.0074 * \ln(n) + 0.1276 \quad (5)$$

where ε is permanent strain
n is the number of cycles at 40% elongation.

Comparative Example 20 is a 4 mil white TPU film sample (SKU TL 644 by Bemis Associates Inc.) The Young's modulus of this material is only 37 MPa which requires a stiffer liner in order to be printed and cured successfully.

For 20% elongation, $$\varepsilon = 0.0053 * \ln(n) + 0.0457 \quad (6)$$

where ε is permanent strain
n is the number of cycles at 20% elongation.

Figure 5:
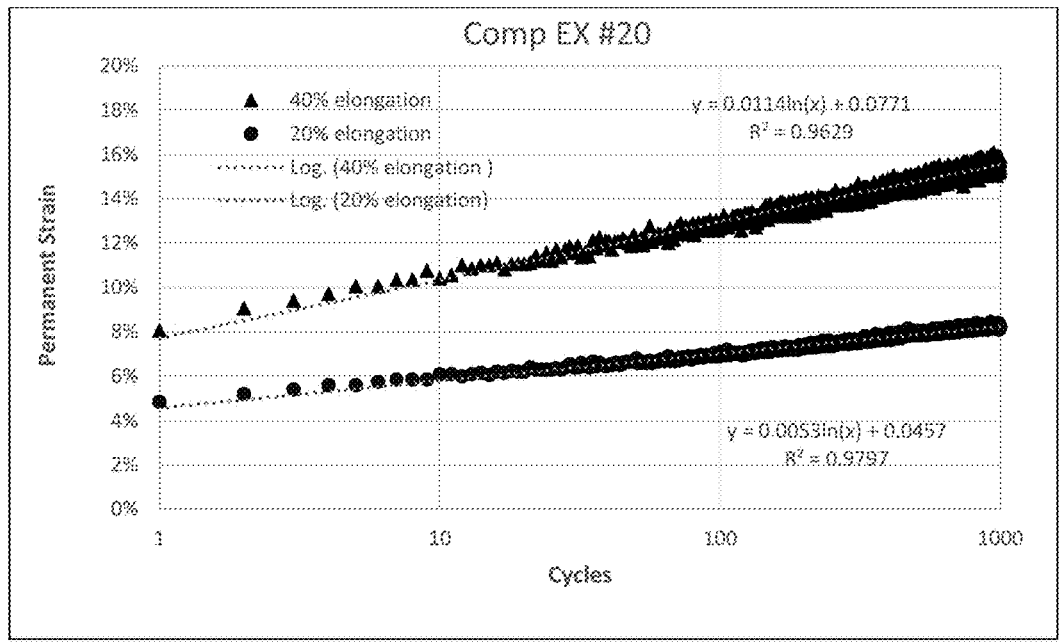
FIG. 5 illustrates Permanent strain up to 1000 cycles at a constant elongation for Example 20.

For 40% elongation, $$\varepsilon = 0.0114 * \ln(n) + 0.0771 \quad (7)$$

where ε is permanent strain
n is the number of cycles at 40% elongation.
Permanent Strain is illustrated in FIG. 5

From Equations (4-7), the permanent strain right after $1^{st}$ cycle and the slope of each linear curve are illustrated in Table 9. Example 9 has higher permanent strain after $1^{st}$ cycle but has lower strain growth rate than Example 20 at 20% and 40% elongation, respectively. Stretchable conductive inks with serpentine printed patterns for example should maintain the same conductivity after repeated elongation cycles.

TABLE 9

Permanent strain after $1^{st}$ cycle and slope of each linear curve.

| | Permanent Strain at first cycle | | Slope | |
|---|---|---|---|---|
| | EX #9 100% A | Comp EX #20 TPU | EX #9 100% A | Comp EX #20 TPU |
| 20% Elongation | 6.6 | 4.9 | 0.0034 | 0.0053 |
| 40% Elongation | 11.5 | 8.1 | 0.0074 | 0.0114 |

All conductive inks, after printed on the substrate, require heat curing to improve conductivity. A typical curing cycle is 120-150° C. for 3-5 min. Heat stability of substrate is critical to maintain dimensional stability of the circuitry. TPU is not heat stable at this temperatures and pre-treatment on a liner must be conducted before printing electronics.

Figure 6:
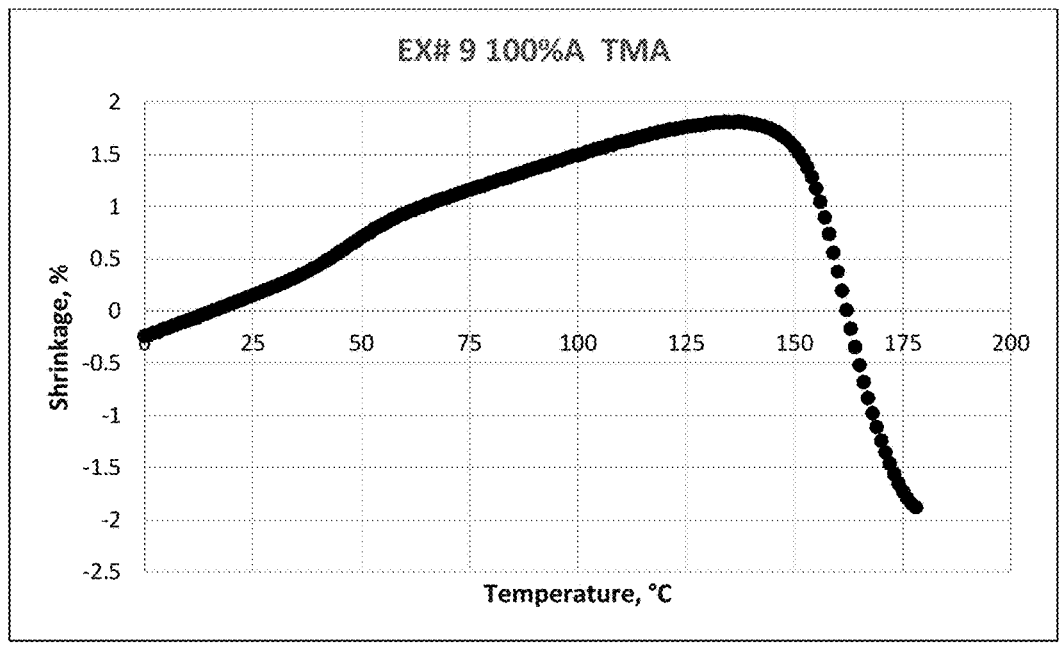
FIG. 6 illustrates TMA shrinkage of Example 9.

FIG. 6 is the TMA shrink curve for Example 9 where the sample is heat stable until the temperature is above 150° C. which is suitable for conductive ink printing and curing for electronics.

Both Example 9 and Comparative Example 20 were tested in a hot air oven at 120° C. and 150° C. for 5 min. The samples were sandwiched in a manila folder and placed in a hot air oven which was set at a desired temperature for 5 minutes to mimic the curing cycle after conductive ink printing. Table 10 shows the test results. Example 9 samples have no shrinkage at both temperature. However, Comparative Example 20 samples were stuck to one side of the folder at 120° C. and fused to both sides of the folder at 150° C. Example 20 sample will not survive in curing cycle after printing without a rigid liner. Example 9 sample on the other hand does not require a liner for the curing process.

TABLE 10

Oven test results for Example 9 and Comparative Example 20.

| | Shrinkage, % | | | |
|---|---|---|---|---|
| | 120° C. for 6 min | | 150° C. for 5 min | |
| | MD | TD | MD | TD |
| EX #9 | 0 | 0 | 0 | 0 |
| Comp EX #20 | Stuck | Stuck | Fused | Fused |

Examples 21-22 and Comparative Examples 23-24

Example 21 is a 2 mil (50 micron) Example 9 sample screen printed with a screen printer using Ag conductive ink, type: 124-36, available from Creative Materials in Ayer, Mass., with a straight pattern. Example 22 is a 2 mil (50 micron) Example 9 sample screen printed using Ag conductive ink with a sinusoidal pattern. Comparative Example 23 is a 4 mil (50 micron) Comparative Example 20 sample with a liner screen printed using Ag conductive ink with a straight pattern. Comparative Example 24 is a 4 mil (50 micron) Comparative Example 20 sample with a liner screen printed using Ag conductive ink with a sinusoidal pattern. The film sample dimensions are 6 cm×16 cm and ink pattern is centered in an area of 1 in×6 in on the sample. Printed samples were cured in a hot air oven at 60° C. for 15 min. The ink can be cured between 50° C. and 150° C. while higher temperatures are more effective. For comparison purpose, all samples were cured at 60° C. since wrinkles were already developed in Comparative Examples 23-24 while there was no distortion in Examples 21-22.

Examples 21-22 and Comparative Examples 23-24 were stretched by an Instron tensile tester (MTS Q-Test) from an initial gauge length of 11.5 cm at 2 in/min strain rate while the resistivity of the printed patterns were measured in-situ by a digital multimeter (Keithley Instruments Inc.) Table 11 shows the initial resistivity after curing and max failure strain after stretching. The resistivity increases slowly with increasing strain while the max failure strain is defined as when the resistivity climbs abruptly. In both straight and sinusoidal ink patterns, Examples 21-22 have higher failure stain than Comparative Examples 23-24, respectively. Since all corresponding samples were screen printed and cured at the same conditions, the higher failure strain can be attributed to better adhesion between Ag conductive ink and Examples 21-22 as compared to Examples 23-24.

TABLE 11

Initial resistivity and failure strain of Ag printed samples.

|  | Ink Pattern | Initial Resistivity Ω | Failure Strain % |
| --- | --- | --- | --- |
| EX #21 | Straight | 22 | 43 |
| Comp EX #23 | Straight | 24 | 26 |
| EX #22 | Sinusoidal | 43 | 45 |
| Comp EX #24 | Sinusoidal | 43 | 35 |

The invention claimed is:

1. A multilayer film adapted for use as a substrate for a printed circuit, said film comprising:
   (a). at least one layer comprising a polyester elastomer which comprises a diacid component comprising 98 to 100 mole % of the residues of 1,4-cyclohexanedicarboxylic acid; a diol component comprising
      (i) 75 to 96 mole % of the residues of 1,4-cyclohexanedimethanol and
      (ii) 4 to 25 mole % of the residues of poly(tetramethylene ether) glycol having a molecular weight of 500 to 1100; and 0.1 to 2 mole %, based on the mole % of the diacid or diol component, of a branching agent having at least three functional groups selected from hydroxyl and carboxyl;
   (b). at least one layer comprising a cycloaliphatic which comprises a diacid component comprising 98 to 100 mole % of the residues of 1,4-cyclohexanedicarboxylic acid; and a diol component comprising 95 to 100 mole % of the residues of 1,4-cyclohexanedimethanol.

2. The multilayer film according to claim 1, comprising at least one adhesive layer between at least one layer comprising a polyester elastomer and at least one layer comprising a cycloaliphatic.

3. The multilayer film of claim 1, wherein the cycloaliphatic component is poly(1,4-cyclohexylenedimethylene-1,4-cyclohexanedicarboxylate).

4. The multilayer film of claim 1, further comprising an electroconductive ink printed on a surface of the substrate.

5. The multilayer film according claim 1, which has a layering arrangement comprising polyester elastomer/cycloaliphatic, polyester elastomer/cycloaliphatic/polyester elastomer, or cycloaliphatic/polyester elastomer/cycloaliphatic.

6. The multilayer film according claim 1, wherein each layer is oriented in at least one direction.

7. A method of making the multilayer film of claim 1, which comprises providing at least one polyester elastomer layer and at least one cycloaliphatic layer; and providing and executing a means for communicating the at least one polyester elastomer layer with the at least one cycloaliphatic layer to create a multilayer film.

8. The method of claim 7, further comprising printing an electroconductive ink on at least one layer of the multilayer film.

9. The method of claim 7, wherein the means for communicating the at least one polyester elastomer layer with the at least one cycloaliphatic layer to create a multilayer film comprises a co-extrusion process.

10. The method of claim 7, wherein the means for communicating the at least one polyester elastomer layer with the at least one cycloaliphatic layer to create a multilayer film comprises a lamination process.

11. The method of claim 7, wherein the means for communicating the at least one polyester elastomer layer with the at least one cycloaliphatic layer to create a multilayer film comprises an extrusion coating process.

12. A stretchable printed circuit film comprising:
   (a) a substrate comprising a multilayer film comprising:
      (i) at least one film layer comprising a polyester elastomer component comprising a diacid component comprising 98 to 100 mole % of the residues of 1,4-cyclohexanedicarboxylic acid; a diol component comprising (i) 75 to 96 mole % of the residues of 1,4-cyclohexanedimethanol and (ii) 4 to 25 mole % of the residues of poly(tetramethylene ether) glycol having a molecular weight of 500 to 1100; and 0.1 to 2 mole %, based on the mole % of the diacid or diol component, of a branching agent having at least three functional groups selected from hydroxyl and carboxyl;
      (ii) at least one film layer comprising a cycloaliphatic component comprising a diacid component comprising 98 to 100 mole % of the residues of 1,4-cyclohexanedicarboxylic acid; and a diol component comprising 95 to 100 mole % of the residues of 1,4-cyclohexanedimethanol; and
      (iii) an electroconductive ink printed on at least one surface of at least one film layer of the substrate.

13. The stretchable printed circuit film of claim 12, wherein the cycloaliphatic component is poly(1,4-cyclohexylenedimethylene-1,4-cyclohexanedicarboxylate).

14. The stretchable printed circuit film of claim 12, wherein at least one film layer is oriented in at least one direction.

15. An article of manufacture which comprises the stretchable printed circuit film according to claim 12.

16. The article of manufacture according to claim 15, comprising a wearable device, a curved display, foldable electronic device, in-mold electronics, E-textiles, stretchable thin film transistor, or transparent conductive film.

17. The stretchable printed circuit film of claim 12, wherein the substrate comprises a plurality of microlayers.

18. A method of making the stretchable printed circuit film of claim 12, which comprises providing at least one film layer comprising a polyester elastomer component; providing at least one film layer comprising a cycloaliphatic component; executing a means for communicating the at least one with the at least film layer comprising a polyester elastomer component with the at least one film layer comprising a cycloaliphatic component to create a multilayer film; printing an electroconductive ink on at least one surface of at least one film layer of the substrate; and curing the ink on the at least one film layer.

19. The method claim 18, further comprising incorporating the stretchable printed circuit film into an article of manufacture.

20. The method of claim 19, wherein the article of manufacture comprises a wearable device, a curved display, foldable electronic device, in-mold electronics, E-textiles, stretchable thin film transistor, or transparent conductive film.

\* \* \* \* \*